US008068328B2

(12) United States Patent
Raravikar et al.

(10) Patent No.: US 8,068,328 B2
(45) Date of Patent: Nov. 29, 2011

(54) NANOLITHOGRAPHIC METHOD OF MANUFACTURING AN EMBEDDED PASSIVE DEVICE FOR A MICROELECTRONIC APPLICATION, AND MICROELECTRONIC DEVICE CONTAINING SAME

(75) Inventors: Nachiket R. Raravikar, Gilbert, AZ (US); Rahul Panat, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 846 days.

(21) Appl. No.: 12/047,277

(22) Filed: Mar. 12, 2008

(65) Prior Publication Data

US 2009/0231777 A1    Sep. 17, 2009

(51) Int. Cl.
*H01G 4/228* (2006.01)

(52) U.S. Cl. ............... 361/306.2; 361/306.1; 361/306.3; 361/313; 361/321.2; 361/301.4

(58) Field of Classification Search ............... 361/306.2, 361/306.1, 301.2, 301.4, 311–313, 306.3, 361/321.2, 321.1, 303–305
See application file for complete search history.

(56) References Cited

U.S. PATENT DOCUMENTS

| | | | |
|---|---|---|---|
| 5,221,415 A | 6/1993 | Albrecht | |
| 5,345,815 A | 9/1994 | Albrecht | |
| 5,399,232 A | 3/1995 | Albrecht | |
| 5,483,822 A | 1/1996 | Albrecht | |
| 5,580,827 A | 12/1996 | Akamine | |
| 5,595,942 A | 1/1997 | Albrecht | |
| 5,742,377 A | 4/1998 | Minne | |
| 5,870,273 A * | 2/1999 | Sogabe et al. ............ 361/306.3 |
| 5,883,705 A | 3/1999 | Minne | |
| 6,075,585 A | 6/2000 | Minne | |
| 6,635,311 B1 | 10/2003 | Mirkin | |
| 6,642,129 B2 | 11/2003 | Liu | |
| 6,700,772 B2 * | 3/2004 | Raghavendra et al. .... 361/321.2 |
| 6,827,979 B2 | 12/2004 | Mirkin | |
| 7,005,378 B2 | 2/2006 | Crocker | |
| 7,034,854 B2 | 4/2006 | Cruchon-Dupeyrat | |
| 7,060,977 B1 | 6/2006 | Dupeyrat | |
| 7,098,056 B2 | 8/2006 | Demers | |
| 7,102,656 B2 | 9/2006 | Mirkin | |
| 7,199,305 B2 | 4/2007 | Cruchon-Dupeyrat | |
| 7,223,438 B2 | 5/2007 | Mirkin | |
| 7,273,636 B2 | 9/2007 | Mirkin | |
| 7,279,046 B2 | 10/2007 | Eby | |
| 7,291,284 B2 | 11/2007 | Mirkin | |
| 7,326,380 B2 | 2/2008 | Mirkin | |
| 7,738,257 B2 * | 6/2010 | Salama et al. ................. 361/763 |
| 2004/0175631 A1 | 9/2004 | Crocker | |
| 2005/0191434 A1 | 9/2005 | Mirkin | |
| 2005/0235869 A1 | 10/2005 | Cruchon-Dupeyrat | |
| 2005/0255237 A1 | 11/2005 | Zhang | |
| 2006/0040057 A1 | 2/2006 | Sheehan | |
| 2007/0008390 A1 | 1/2007 | Cruchon-Dupeyrat | |

FOREIGN PATENT DOCUMENTS

EP            0619872 B1        3/2008

* cited by examiner

*Primary Examiner* — Nguyen T Ha
(74) *Attorney, Agent, or Firm* — Kenneth A. Nelson (57) ABSTRACT

A method of manufacturing an embedded passive device for a microelectronic application comprises steps of providing a substrate (110, 210, 310), nanolithographically forming a first section (121, 221, 321) of the embedded passive device over the substrate, and nanolithographically forming subsequent sections (122, 222, 322) the embedded passive device adjacent to the first section. The resulting embedded passive device may contain features less than approximately 100 nm in size.

12 Claims, 4 Drawing Sheets

NANOLITHOGRAPHIC METHOD OF MANUFACTURING AN EMBEDDED PASSIVE DEVICE FOR A MICROELECTRONIC APPLICATION, AND MICROELECTRONIC DEVICE CONTAINING SAME

FIELD OF THE INVENTION

The disclosed embodiments of the invention relate generally to nanolithography, and relate more particularly to embedded passive devices manufactured using nanolithographic techniques.

BACKGROUND OF THE INVENTION

Microelectronic circuits contain various components that produce electromagnetic radiation capable of influencing other circuit components. Switching noise, voltage droop, parasitic inductance, and similar issues can negatively affect circuit performance if left unaddressed. Accordingly, decoupling (or "bypass") capacitors have been used in microelectronic circuits to decouple one part of an electrical circuit from another so that the negative effect of circuit noise is lessened.

For example, a ceramic capacitor has pairs of electrodes separated by dielectric material. The capacitance C of the capacitor is given by the formula $C=(kAn)/d$, where k is the dielectric constant of the dielectric material, A is the active area of the electrodes, n is the number of layers (with at least one of the layers consisting of an electrode pair plus the separating dielectric), and d is the thickness of each layer. As may quickly be seen from the formula, one way to increase capacitance is to decrease the dielectric layer thickness. The dielectric layer thickness can be reduced to about 1 micron in current-generation multiple-layer ceramic capacitors (MLCCs).

BRIEF DESCRIPTION OF THE DRAWINGS

The disclosed embodiments will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of manufacturing an embedded passive device (e.g., a capacitor, a resistor, or a fuse) for a microelectronic application comprises steps of providing a substrate, nanolithographically forming a first section of the embedded passive device over the substrate, and nanolithographically forming subsequent sections of the embedded passive device adjacent to the first section. The resulting embedded passive device may contain features less than approximately 100 nanometers (nm) in size.

It was mentioned above that a capacitor is a possible embedded passive device according to an embodiment of the invention, and that the dielectric layer thickness can be reduced to about 1 micron in current generation MLCCs. Due to limitations with the current manufacturing method (tape casting), it is not possible to go to sub-100 nm length scales. Further, at smaller length scales (less than approximately 100 nm or so) precise control and placement of materials becomes difficult. Therefore, it becomes increasingly challenging to reduce capacitor dimensions in order to offer the highest possible capacitance.

Moreover, current trends in the semiconductor industry indicate that, with miniaturization at the silicon and the device level, system level integration will be critical. Thus new assembly processes will be needed to conduct seamless integration of various components into a single package. The performance of the scaled-down components would of course be expected to equal or improve upon the performance of their existing (larger) counterparts. From that point of view also, creation and integration of high-capacitance capacitors with ultra-small (nanometer scale) feature size presents a challenge.

Embodiments of the invention offer a way to break the length scale barriers mentioned above. Accordingly, embodiments of the invention may enable a decrease in capacitor dielectric layer thickness without compromising reliability as well as the creation of nanometer-scale capacitors with seamless package-integration capability. The resulting increase in capacitance can be more than an order of magnitude according to some embodiments. Moreover, the ease with which embodiments of the invention can be integrated into substrates and into any of the package elements mean that an embedded capacitor (or other embedded passive device) could be placed very close to the die and/or the voltage regulators, thus helping to reduce voltage droop and electrical losses. Embodiments of the invention may also significantly reduce the form factor of a capacitor for equivalent capacitance. Embodiments of the invention may further enable smallest possible feature sizes and tailored capacitance, with molecular-level control being achievable on the capacitor assembly.

Figure 1:
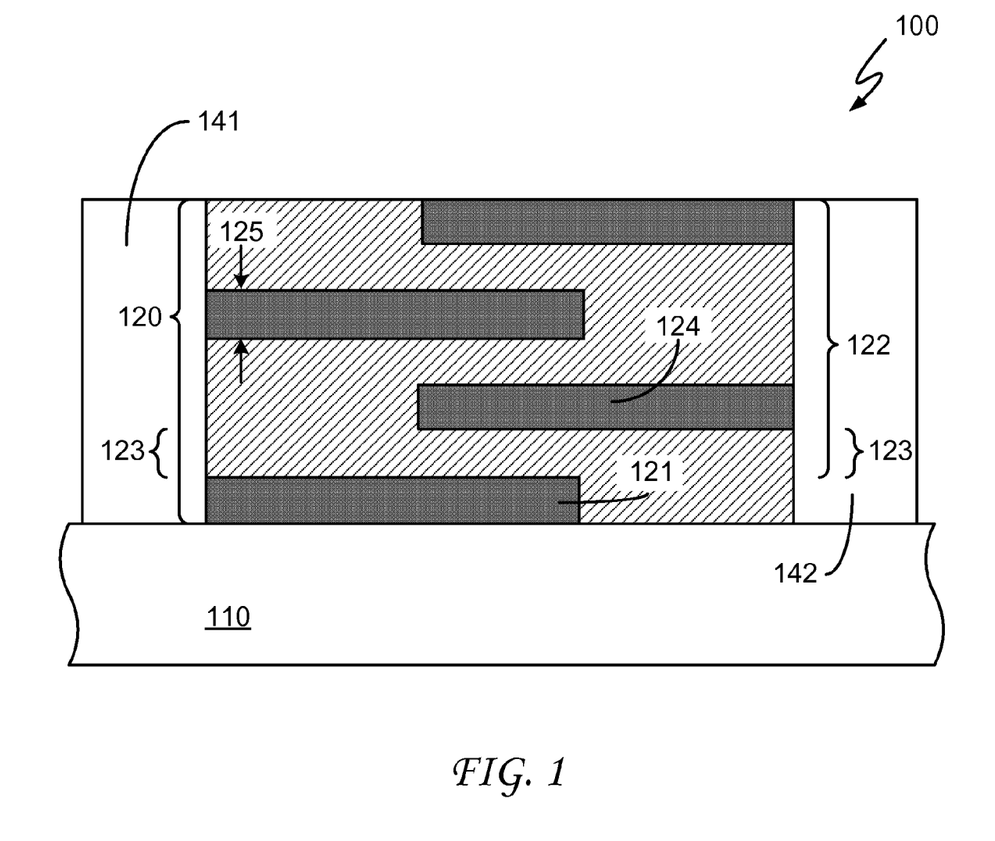
FIG. 1 is a cross-sectional view of a portion of a microelectronic device containing an embedded passive device according to an embodiment of the invention.

Referring now to the drawings, FIG. 1 is a cross-sectional view of a portion of a microelectronic device 100 according to an embodiment of the invention. As illustrated in FIG. 1, microelectronic device 100 comprises a substrate 110 and an embedded passive device 120 over substrate 110. Electrical connections 141 and 142 make contact with embedded passive device 120 in a manner and for a purpose that will be described below. (Because electrical connections 141 and 142 are often made of copper these connections are frequently referred to as "substrate copper lines.") Embedded passive device 120 comprises a section 121 over substrate 110 and subsequent sections 122 adjacent to section 121. At least one of section 121 and sections 122 have a thickness 125 of no greater than 100 nanometers.

It should perhaps be emphasized that although at least one section of embedded passive device 120 has a thickness no greater than 100 nanometers, other sections may have thicknesses (or other dimensions) larger than that. The particular section indicated in FIG. 1 as having thickness 125 is used for illustrative purposes only; it may or may not be the section (or one of the sections) having that particular thickness. This comment also applies to subsequent figures described herein unless otherwise indicated.

As an example, substrate 110 can be a ceramic substrate or, in a different embodiment, an organic substrate. The choice of substrate material may influence the choice of other materials used to manufacture embedded passive devices according to embodiments of the invention, such as the choice of solvent material, to be introduced and further discussed below, and may also influence certain manufacturing steps and processes, as will also be further discussed below.

Embodiments of the invention employ metal-organic electrode materials and organo-ceramic dielectrics. In some embodiments these materials are introduced in a semi-solid form in order to assist the manufacturing process and later harden to their final solid form. These materials may be introduced by attaching them to molecules (e.g., a thiol group, an alkyl group, or the like) suspended in a solvent and then printing them onto a substrate to form an embedded passive device. The solvent acts as a carrier for the molecules and the attached materials. As an example, appropriate solvents may comprise water, ethylene glycol, chloroform, dimethyl formamine (DMF), methanol, and methylene chloride, among others.

In one embodiment, some of the materials attached to such molecules are particles of nickel, copper, gold, palladium, or another metal destined for a metal electrode of embedded passive device 120. As an example, section 121 can be an electrode of embedded passive device 120. As another example, sections 122 can include additional electrodes.

In the same or another embodiment, others of the materials attached to such molecules include barium titanate (BT), strontium titanate, lead zirconate titanate suspensions, silica particle colloidal suspensions, silane-coated BT, or other ceramic dielectric particles or the like destined for a dielectric layer of embedded passive device 120. In other embodiments the materials destined for the dielectric layer comprise an organic dielectric material such as conjugated polymers or the like. The choice of dielectric material may depend, at least in part, on the application for which the embedded passive device is intended and, more specifically, on the amount of dielectric constant, the temperature susceptibility, the cost parameters, and so forth required by the particular application. As an example, sections 122 can include sections of dielectric material (in addition to electrode sections).

It may be seen that the embodiment illustrated in FIG. 1—embedded passive device 120—has a vertical orientation in which a first one of sections 122—called section 123—is located above section 121 and a second one of sections 122—called section 124—is located above section 123. Other embodiments have different orientations, as will be further discussed below. In at least one embodiment, section 123 is made of dielectric material and section 124 is a metal electrode.

Some methods used in forming embedded passive devices according to embodiments of the invention work best on materials such as alumina, silica, silicon, and other ceramic substrates and have traditionally not been utilized in connection with the organic substrates typically used for microelectronic devices of the type under discussion here. This would especially be the case where the solvents or other materials used in the formation process interact adversely with the organic substrate to cause swelling or dissolution of substrate materials. To address this issue, in certain embodiments the microelectronic device further comprises a thin glass layer or other insulating ceramic between an organic substrate and the embedded passive device. One such embodiment is illustrated in FIG. 2, which is a cross-sectional view of a portion of a microelectronic device 200 according to an embodiment of the invention.

Figure 2:
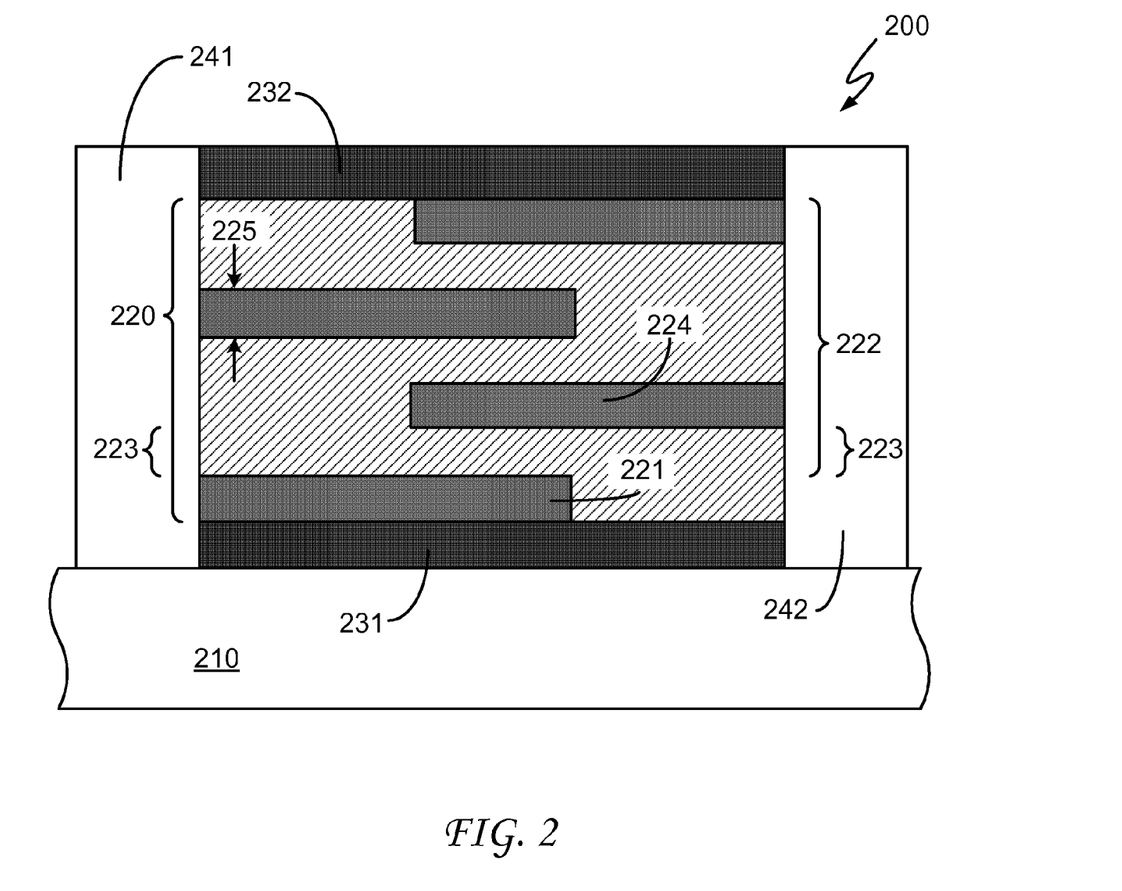
FIG. 2 is a cross-sectional view of a portion of a microelectronic device according to another embodiment of the invention.

As illustrated in FIG. 2, microelectronic device 200 comprises a substrate 210 and an embedded passive device 220 over substrate 210. Electrical connections 241 and 242 make contact with embedded passive device 220. Embedded passive device 220 comprises a section 221 over substrate 210 and subsequent sections 222 adjacent to section 221. As an example, substrate 210, embedded passive device 220, section 221, subsequent sections 222, and electrical connections 241 and 242 can be similar to, respectively, substrate 110, embedded passive device 120, section 121, subsequent sections 122, and electrical connections 141 and 142, all of which are shown in FIG. 1. Accordingly, at least one of section 221 and sections 222 have a thickness 225 of no greater than 100 nanometers.

Microelectronic device 200 further comprises an insulating ceramic layer 231 between substrate 210 and section 221 and an insulating ceramic layer 232 above an uppermost one of sections 222. As an example, one or both of insulating ceramic layers 231 and 232 can be a thin layer of glass or the like, with thicknesses ranging from, for example, approximately a few tens of nanometers up to approximately a few hundred nanometers or even to approximately a micron or more. In one embodiment the glass may be applied using a spin coating technique.

From the foregoing description it may be deduced that the embodiment illustrated in FIG. 2—embedded passive device 220—has a vertical orientation, just as does embedded passive device 120 of FIG. 1. As shown in FIG. 2, this means, at least for this embodiment, that a first one of sections 222—called section 223—is located above section 221 and a second one of sections 222—called section 224—is located above section 223. As an example, section 223 and section 224 can be similar to, respectively, sections 123 and 124 of embedded passive device 120, both of which are shown in FIG. 1.

A method of protecting an organic substrate from solvents or other materials (using an insulating ceramic layer) was described above. It should be noted, however, that insulating ceramic layers need not always be used with organic substrates. Certain solvents, for example, do not adversely affect organic materials and these may be used in embodiments where the embedded passive device is formed directly on an organic substrate with no intervening insulating ceramic layer. As an example, water tends not to wet on organic materials and therefore may work well as a solvent in this context. Water is also environmentally friendly and can be removed with a low-temperature bake. More generally, any substance that does not cause an organic substrate to swell, dissolve, or otherwise be compromised—e.g., a substance in which the organic substrate is not soluble—would be a candidate for use with an organic substrate.

Figure 3:
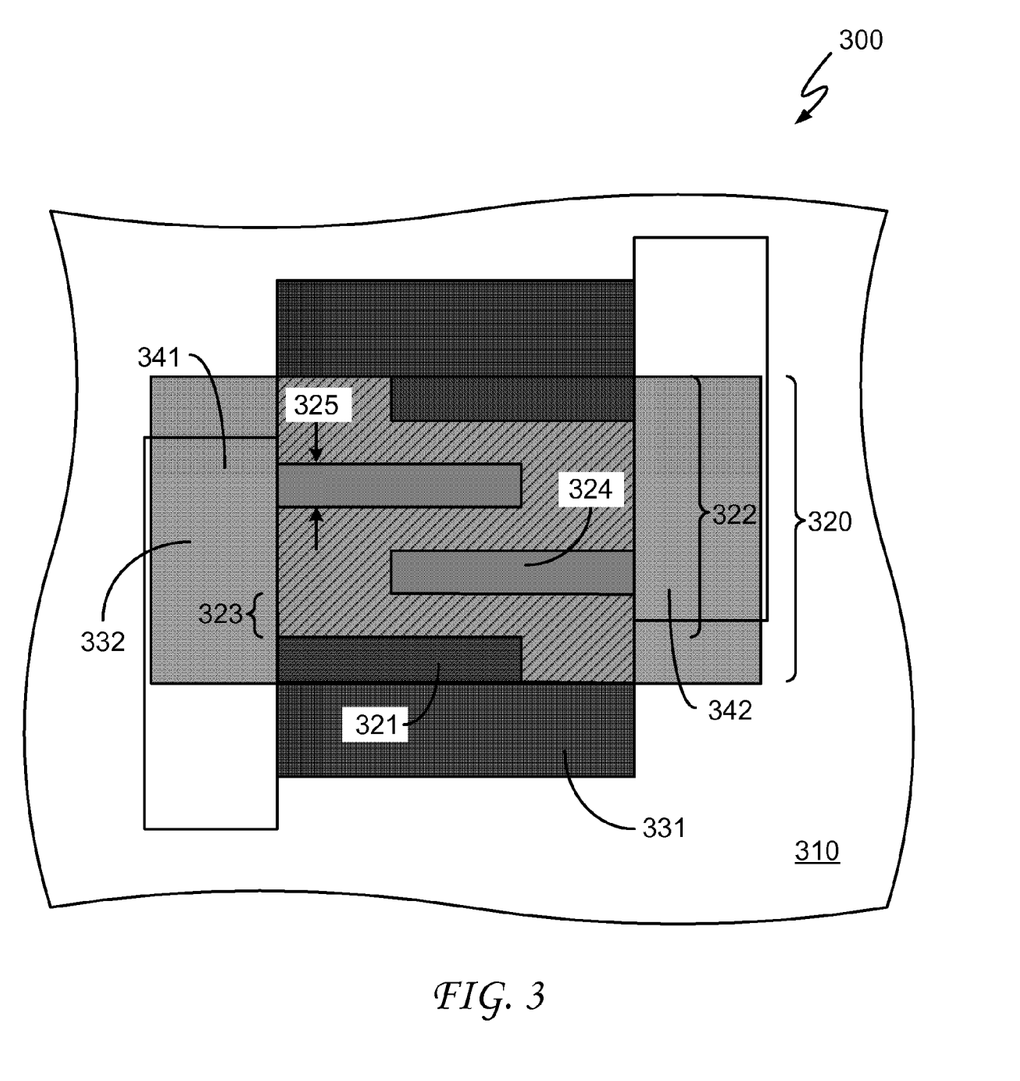
FIG. 3 is a plan view of a portion of a microelectronic device according to another embodiment of the invention.

FIG. 3 is a plan view of a portion of a microelectronic device 300 according to an embodiment of the invention. As illustrated in FIG. 3, microelectronic device 300 comprises a substrate 310 and an embedded passive device 320 over substrate 310. Electrical connections 341 and 342 make contact with embedded passive device 320. Embedded passive device 320 comprises a section 321 over substrate 310 and subsequent sections 322 adjacent to section 321. As an example, substrate 310, embedded passive device 320, section 321, subsequent sections 322, and electrical connections 341 and 342 can be similar to, respectively, substrate 110, embedded passive device 120, section 121, subsequent sections 122, and electrical connections 141 and 142, all of which are shown in FIG. 1. Accordingly, at least one of section 321 and sections 322 have a thickness 325 of no greater than 100 nanometers.

Microelectronic device 300 further comprises an insulating ceramic layer 331 between substrate 310 and embedded passive device 320 and an insulating ceramic layer 332 above embedded passive device 320. As an example, insulating ceramic layers 331 and 332 can be similar to insulating ceramic layers 231 and 232 that are shown in FIG. 2. These or similar layers are required, in at least one embodiment, in order to protect the electrodes from electrical short circuit due to contact with external substrate metal lines. Also, in various embodiments, the use of such insulating layers enables multiple passives to be lithographically printed ("stacked") on top of each other.

From the foregoing description it may be deduced that the embodiment illustrated in FIG. 3—embedded passive device 320—has a horizontal orientation. As shown in FIG. 3, this means, at least for this embodiment, that each one of sections 322—including a section 323 and a section 324—are located alongside and in the same plane as section 321, which plane is substantially parallel to a plane of substrate 310. As an example, section 323 and section 324 can be similar to, respectively, sections 123 and 124 of embedded passive device 120, both of which are shown in FIG. 1.

Figure 4:
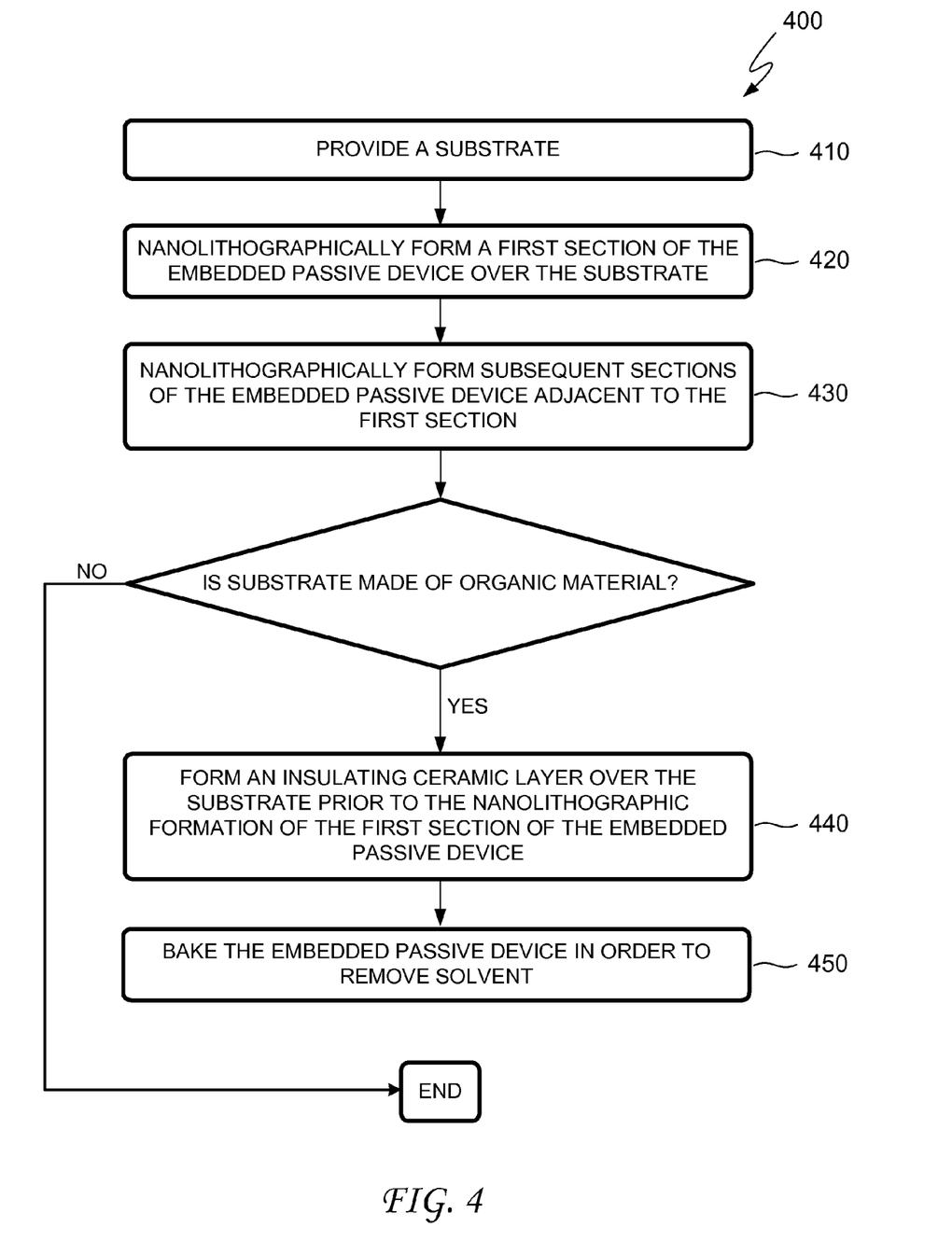
FIG. 4 is a flowchart illustrating a nanolithographic method of manufacturing an embedded passive device for a microelectronic application according to an embodiment of the invention.

FIG. 4 is a flowchart illustrating a nanolithographic method 400 of manufacturing an embedded passive device for a microelectronic application according to an embodiment of the invention. As set out in more detail below, method 400, or other methods according to other embodiments of the invention, involves the layer-by-layer build up of alternating electrode layers and dielectric layers. This process may be followed by a sintering operation that removes solvents and volatile organic matter and also enhances compaction and rigidity—mechanical stability—of the embedded passive device. Embedded thin film capacitors or other embedded passive devices may be formed in substrates, on silicon, on or very close to voltage regulators, printed on motherboards, etc., where needed.

If the embedded passive device is to be a capacitor, method 400 (or another method according to other embodiments of the invention) is capable of developing capacitors with small feature sizes, built layer by layer, using materials selected to enable desired design parameters. Tunable capacitance could be achieved by selecting the appropriate combination of dielectric materials, electrode materials, and layer thicknesses and configurations.

Capacitors require an alternating structure of metallic electrodes and dielectric material. Therefore, according to an embodiment of the invention, an electrode is coated on a given substrate at a given location, a dielectric layer is coated on top of that, followed by a metal electrode above those layers, and so on. Embodiments of the invention give precise control over placement, thickness, and lateral dimensions on the order of less than 100 nm. Molecular level control thus is possible, assuming the radius of gyrations of some polymeric resins like uncured epoxy to be in the range of 50-60 nm.

In certain embodiments, two-dimensional networks of many thousands of probes could be employed to print materials, a technique that could be used to simultaneously create multiple capacitors in a given package. Such probes could be positioned according to the precise locations where capacitors are desired, each probe having inks filled with solutions of dielectrics or metals, as required. This process could also be very fast, since the probe movements would be robotically controlled.

A step 410 of method 400 is to provide a substrate. As an example, the substrate can be similar to substrate 110 that is shown in FIG. 1. Accordingly, as mentioned above, in one embodiment the substrate may be a ceramic substrate and in another embodiment the substrate may be an organic substrate.

A step 420 of method 400 is to nanolithographically form a first section of the embedded passive device over the substrate. The first section (and/or another section of the embedded passive device) may be placed in electrical contact with metals lines or pads of substrate in order to enable contact with external substrate circuitry. As an example, the first section can be similar to section 121 of embedded passive device 120 that is shown in FIG. 1. As another example, the metal lines can be similar to electrical connections 141 and 142 that are also shown in FIG. 1.

In one embodiment, step 420 comprises nanolithographically forming a first electrically conducting section. As an example, the first electrically conducting section may be capable of acting as a metal electrode of an embedded capacitor or an embedded resistor or as a low melting point section of a fuse.

Nanolithography is the fabrication of patterns or structures having nanometer-sized features. Therefore, to nanolithographically form a structure is to produce a structure having at least one dimension that is no larger than approximately 100 nm in size and perhaps as small as a single atom. Various nanolithography methods have been investigated, including optical nanolithography, extreme ultraviolet nanolithography, charged particle nanolithography, and others. Scanning probe nanolithography is a nanolithography method that has shown promise for patterning at the sub-100 nanometer scale. In scanning probe nanolithography, individual atoms are manipulated using a sharp tip or probe such as, for example, the tip of a scanning tunneling microscope (STM), an atomic force microscope (AFM), or the like. Dip Pen Nanolithography® (DPN®), developed by NanoInk, Inc. with headquarters in Skokie, Ill., is one example of this technique. DPN uses an AFM tip to transfer molecules to a surface using a solvent meniscus carrier. Any of the foregoing nanolithography methods and techniques, along with others not specifically mentioned, may be used with embodiments of the invention.

A step 430 of method 400 is to nanolithographically form subsequent sections of the embedded passive device adjacent to the first section. Precise printing of dielectrics and metals made possible by embodiments of the invention ensure proper electrode separation. As an example, the subsequent sections can be similar to sections 122 that are shown in FIG. 1. Due to the molecular-level precision of scanning probe and other nanolithography techniques, it would be possible to create layers having thicknesses of approximately 100 nm or less. Thus, a capacitor with, for example, five alternating metal and dielectric layers could have a thickness of only approximately one micrometer.

In one embodiment, step 430 comprises forming at least a first electrically insulating section (e.g., a dielectric layer) adjacent to the first electrically conducting section and nanolithographically forming at least a second electrically conducting section (e.g., another metal electrode) adjacent to the first electrically insulating section such that the embedded passive device acts as a capacitor. In a different embodiment, step 430 comprises nanolithographically forming at least one electrically conducting section with high resistance such that the embedded passive device is a resistor. In yet another embodiment, step 430 or another step comprises nanolithographically forming at least one low melting point section on metal wire to form a fuse. The low melting point materials may include but are not limited to lead-based solders or tin-silver-copper (Sn—Ag—Cu (SAC)) solders.

In one embodiment, method 400 results in a capacitor having a vertical orientation in which the first electrically insulating section is located above the first electrically conducting section and the second electrically conducting section is located above the first electrically insulating section. In another embodiment, method 400 results in a capacitor having a horizontal orientation in which the first section and each of the subsequent sections are located in a plane that is parallel to a plane of the substrate. In either case, because the first and the subsequent sections are formed over an underlying substrate, method 400 and similar methods according to other embodiments of the invention may be referred to as "bottom-up" methods, meaning methods that build from molecular layers to form a macroscopic device.

A step 440 of method 400 is to form an insulating ceramic layer over the substrate prior to the nanolithographic formation of the first section of the embedded passive device. As an example, this step may be performed in embodiments where the substrate is an organic substrate, for reasons such as those discussed above. In such embodiments, as in other cases where step 440 is performed, step 420 (which is to nanolithographically form a first section of the embedded passive device over the substrate) may more specifically comprise nanolithographically forming the first section of the embedded passive device over the insulating ceramic layer which is itself located over the substrate.

It should be noted that although FIG. 4 depicts step 440 as being performed only in cases where the substrate is an organic substrate, such is not necessarily always the case. In some embodiments, as discussed above, the embedded passive device may be formed directly on an organic substrate without first forming an insulating layer on the substrate.

In one such embodiment the embedded passive device may be a horizontally-oriented capacitor in which the first electrically conducting section and a first plurality of the subsequent sections are located in a plane that is parallel to a plane of the substrate. In that embodiment, method 400 may further comprise forming a second insulating ceramic layer over the first section and the first plurality of the subsequent sections and still further comprise forming a second plurality of the subsequent sections over the second insulating ceramic layer. The second plurality of the subsequent sections may include at least a third electrically conducting section, a fourth electrically conducting section, and a second electrically insulating section in between the third and fourth electrically conducting sections. The second electrically conducting section and the second plurality of the subsequent sections are located in a second plane that is parallel to the plane of the substrate. Additional layers of similar composition may be formed in similar fashion in a vertical stack containing many embedded passive devices. This method may enable enormous capacitance in the same foot print since it enables 3-D integration of metal and dielectric layers.

A step 450 of method 400 is to bake the embedded passive device in order to remove solvent. The assembly process can then be continued according to known assembly processes and techniques. Depending upon intended applications, with their associated required capacitance, assembly processes, etc., the final embedded passive device structure may or may not be sintered, as further discussed in the following paragraph.

In certain embodiments, method 400 may further comprise a step of removing solvent from the dielectric and/or the electrode, crosslinking of the dielectric, or sintering of the dielectric and/or the electrode for the embedded passive device. These operations occur at a temperature referred to herein as a "forming temperature." In particular embodiments, the forming temperature is on the order of 200 degrees Celsius (200° C.). As an example, where a polymeric material is a dielectric, the forming temperature can be the cross-linking temperature. In other embodiments, such as when using BT-based capacitors as the dielectric, the forming temperature may be the sintering temperature. Since the dielectric particles are at a sub-100 nm length scale, the sintering temperature is expected to be low (on the order of approximately 200° to 300° C.). The organic linkers in the ceramic or the polymeric dielectric materials would be chosen such that the removal of these materials could be conducted at low temperatures (e.g., less than approximately 200° C.) without affecting the transistor structures in silicon or substrate materials. As an example, small molecules may be chosen for the organic linkers to enable such forming temperatures. In conventional MLCCs, ceramic sintering is needed and thus the required sintering temperatures are greater than 1000° C.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic device and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A nanolithographic method of manufacturing an embedded passive device for a microelectronic application, the nanolithographic method comprising:
    providing a substrate;
    nanolithographically forming a first section of the embedded passive device over the substrate; and
    nanolithographically forming subsequent sections of the embedded passive device adjacent to the first section.

2. The nanolithographic method of claim 1 wherein:
    nanolithographically forming the first section comprises nanolithographically forming a first electrically conducting section; and
    nanolithographically forming subsequent sections comprises nanolithographically forming at least a first electrically insulating section adjacent to the first electrically conducting section and nanolithographically forming at least a second electrically conducting section adjacent to the first electrically insulating section such that the embedded passive device is a capacitor.

3. The nanolithographic method of claim 2 wherein:
    the capacitor has a vertical orientation in which the first electrically insulating section is located above the first electrically conducting section and the second electrically conducting section is located above the first electrically insulating section.

4. The nanolithographic method of claim 2 wherein:
    the capacitor has a horizontal orientation in which the first section and each of the subsequent sections are located in a plane that is parallel to a plane of the substrate.

5. The nanolithographic method of claim 1 wherein:
    the substrate is a ceramic substrate.

6. The nanolithographic method of claim 1 wherein:
    the substrate is an organic substrate.

7. The nanolithographic method of claim 6 further comprising:
    forming an insulating ceramic layer over the organic substrate prior to the nanolithographic formation of the first section of the embedded passive device; and
    nanolithographically forming the first section of the embedded passive device comprises nanolithographically forming the first section of the embedded passive device over the insulating ceramic layer.

8. The nanolithographic method of claim 7 wherein:
    nanolithographically forming the first section comprises nanolithographically forming a first electrically conducting section;
    nanolithographically forming subsequent sections comprises nanolithographically forming at least a first electrically insulating section adjacent to the first electrically conducting section and nanolithographically forming at least a second electrically conducting section adjacent to the first electrically insulating section such that the embedded passive device is a capacitor;
    the capacitor has a horizontal orientation in which the first electrically conducting section and a first plurality of the subsequent sections are located in a plane that is parallel to a plane of the substrate;
    the nanolithographic method further comprises:
    forming a second insulating ceramic layer over the first section and the first plurality of the subsequent sections; and
    forming a second plurality of the subsequent sections over the second insulating ceramic layer, the second plurality of the subsequent sections including at least a third electrically conducting section, a fourth electrically conducting section, and a second electrically insulating section in between the third and fourth electrically conducting sections; and
    the second electrically conducting section and the second plurality of the subsequent sections are located in a second plane that is parallel to the plane of the substrate.

9. The nanolithographic method of claim 1 wherein:
    nanolithographically forming the first section or nanolithographically forming subsequent sections comprises nanolithographically forming at least one electrically conducting section with a resistance such that the embedded passive device is a resistor.

10. The nanolithographic method of claim 1 wherein:
    nanolithographically forming the first section or nanolithographically forming subsequent sections comprises nanolithographically forming at least one low melting point section on a metal wire to form a fuse.

11. A nanolithographic method of manufacturing an embedded passive device for a microelectronic application, the nanolithographic method comprising:
    providing a substrate;
    nanolithographically forming a first section of the embedded passive device over the substrate; and
    nanolithographically forming subsequent sections of the embedded passive device adjacent to the first section, wherein:
        nanolithographically forming the first section or nanolithographically forming subsequent sections comprises nanolithographically forming at least one low melting point section on a metal wire to form a fuse.

12. A nanolithographic method of manufacturing an embedded passive device for a microelectronic application, the nanolithographic method comprising:
    providing an organic substrate;
    forming an insulating ceramic layer over the organic substrate;
    nanolithographically forming a first electrically conducting section of the embedded passive device over the insulating ceramic layer;
    nanolithographically forming subsequent sections of the embedded passive device, the subsequent sections including at least a first electrically insulating section adjacent to the first electrically conducting section and a second electrically conducting section adjacent to the first electrically insulating section such that the embedded passive device is a capacitor, the capacitor having a horizontal orientation in which the first electrically conducting section and a first plurality of the subsequent sections are located in a plane that is parallel to a plane of the organic substrate;

forming a second insulating ceramic layer over the first section and the first plurality of the subsequent sections; and forming a second plurality of the subsequent sections over the second insulating ceramic layer, the second plurality of the subsequent sections including at least a third electrically conducting section, a fourth electrically conducting section, and a second electrically insulating section in between the third and fourth electrically conducting sections, wherein the second electrically conducting section and the second plurality of the subsequent sections are located in a second plane that is parallel to the plane of the substrate.

* * * * *